United States Patent
Strupeit et al.

(10) Patent No.: US 8,753,592 B2
(45) Date of Patent: Jun. 17, 2014

(54) III-V NANOPARTICLES AND METHOD FOR THEIR MANUFACTURE

(75) Inventors: Tim Strupeit, Hamburg (DE); Horst Weller, Hamburg (DE); Andreas Kornowski, Hamburg (DE)

(73) Assignee: Centrum fur Angewandte Nanotechnologie (CAN) GmbH, Hamburg (DE)

( * ) Notice: Subject to any disclaimer, the term of this patent is extended or adjusted under 35 U.S.C. 154(b) by 0 days.

(21) Appl. No.: 12/744,157

(22) PCT Filed: Sep. 19, 2008

(86) PCT No.: PCT/EP2008/062527
§ 371 (c)(1),
(2), (4) Date: Jul. 26, 2010

(87) PCT Pub. No.: WO2009/065639
PCT Pub. Date: May 28, 2009

(65) Prior Publication Data
US 2010/0316549 A1    Dec. 16, 2010

(30) Foreign Application Priority Data

Nov. 22, 2007 (GB) .................................. 0722920.6

(51) Int. Cl.
*C01B 25/08* (2006.01)
*C01G 28/00* (2006.01)
*C01G 15/00* (2006.01)

(52) U.S. Cl.
CPC ............. *C01B 25/087* (2013.01); *C01G 15/00* (2013.01)
USPC .............................. 423/87; 423/111; 423/299

(58) Field of Classification Search
CPC .... C01G 15/00; C01G 15/003; C01G 15/006; C01B 25/087; C01P 2004/62; C01P 2004/64
USPC ............ 423/111, 299, 495; 75/348, 349, 351; 977/773, 810, 896
See application file for complete search history.

(56) References Cited

U.S. PATENT DOCUMENTS

| | | | |
|---|---|---|---|
| 4,185,081 A | 1/1980 | Fauth et al. | |
| 4,783,320 A | 11/1988 | Adamski et al. | |
| 6,315,965 B1 * | 11/2001 | Horn Feja et al. | 422/232 |
| 6,788,453 B2 * | 9/2004 | Banin et al. | 359/342 |
| 2003/0106488 A1 | 6/2003 | Huang et al. | |
| 2005/0112849 A1 | 5/2005 | Stott et al. | |

FOREIGN PATENT DOCUMENTS

| | | |
|---|---|---|
| CN | 1912048 A | 2/2007 |
| EP | 1990311 A1 | 11/2008 |
| GB | 2356395 A | 5/2001 |
| WO | 2006099386 A1 | 9/2006 |
| WO | 2007099794 A1 | 9/2007 |

OTHER PUBLICATIONS

Yan et al, A Low-Temperature Route to InP Nanocrystals J. Mater. Chem. 1999, 9, pp. 1831-1833.*
Khanna et al, "Synthesis of InP nanocrystals from indium chloride and sodium phosphide by solution route" 2006, Materials Chemistry and Physics vol. 96 pp. 494-497.*
Battaglia et al, "Formation of High Quality InP and InAs Nanocrystals in a noncoordinating solvent," 2002, Nano Letters vol. 2 No. 9 1027-1030.*
Chan, W. et al., "Luminescent quantum dots for multiplexed biological detection and imaging", "Current Opinion in Biotechnology", 2002, pp. 40-46, vol. 13.
Malik, M. et al., "Gallium arsenide nanoparticles: synthesis and characterisation", "Journal of Materials Chemistry", Sep. 4, 2003, pp. 2591-2595, vol. 13.
Micic, O. et al. , "Synthesis and Characterization of InP, GaP, and GaInP2 Quantum Dots", "J.Phys. Chem.", 1995, pp. 7754-7759, vol. 99.
Micic, O. et al. , "Synthesis and Characterization of Binary and Ternary III-V Quantum Dots", "Journal of Luminescence", 1996, pp. 95-107, vol. 70.
Sun, Z. et al. , "A Novel Approach for the Preparation of IP NanoCrystals", "Material Research Society Symposium Proc.", 2006, pp. 16, vol. 942, Publisher: Material Research Society.
Micic, O., et al., "Sythesis and Characterization of INP Quantum Dots", May 1994, pp. 4966-4969, vol. 98, No. 19, Publisher: The Journal of Physical Chemistry.
Guzelian, A., et al., "Synthesis of Size-Selected, Surface-Passivated InP Nanocrystals", "J. Phys. Chem.", 1996, pp. 7212-7219, vol. 100.
Note: For the non-patent literature citations that no month of publication is indicated, the year of publication is more than 1 year prior to the effective filing date of the present application.

* cited by examiner

*Primary Examiner* — Steven Bos
*Assistant Examiner* — Justin Bova
(74) *Attorney, Agent, or Firm* — Hultquist, PLLC; Steven J. Hultquist; Mary B. Grant

(57) ABSTRACT

A method for the manufacture of a III-V compound in the form of nanoparticles, such as those used in semi-conductors. The reaction proceeds at atmospheric pressure in a reaction solution by the reaction of a III compound source and a V compound source. The reaction proceeds in solvent of high boiling point. The solvent contains a stabilizer and a base. The manufactured III-V compound is precipitated from the reaction solution, isolated, purified and analyzed.

12 Claims, 9 Drawing Sheets

III-V NANOPARTICLES AND METHOD FOR THEIR MANUFACTURE

TECHNICAL FIELD

The present invention relates to a method for the manufacture of III-V particles.

CROSS REFERENCE TO RELATED APPLICATIONS

This application is a U.S. national phase application under the provisions of 35 U.S.C. §371 of International Application No. PCT/EP08/62527 filed Sep. 19, 2008, which in turn claims priority of United Kingdom Patent Application No. GB0722920.6 filed Nov. 22, 2007. The disclosures of such international application and United Kingdom priority application are hereby incorporated herein by reference in their respective entireties, for all purposes.

BACKGROUND ART

Methods for the manufacture of III-V semi-conducting particles, such as indium phosphide, are known in the literature. For example, U.S. Pat. No. 4,783,320 (Adamski et al, assigned to the United States of America as represented by the Secretary of the Air Force) teaches a process for the high pressure synthesis of InP using an independent temperature control of a three zone furnace incorporating a heat pipe that provides a stable temperature profile throughout the synthesis cycle. This apparatus and method disclosed in the U.S. Pat. No. 4,783,320 teaches the manufacture of InP by directly reacting the elements Indium (In) and Phosphorus (P) in the furnace at temperatures above 800° C.

U.S. Pat. No. 4,185,081 (Fauth et al, assigned to the United States of America as represented by the Secretary of the Air Force) teaches a method for manufacturing InP which is similar to the method taught in the Adamski U.S. Pat. No. 4,783,320. The U.S. Pat. No. 4,185,081 discloses the direct reaction of the elements In and P in a controlled apparatus. The apparatus utilises specific heating, cooling and pressurising to safely produce InP.

UK patent application GB2356395 (Venezia Tecnologie S.p.A) discloses a further method for the direct manufacture of InP, whereby the elements In and P are directly reacted in a closed system at temperatures above 1000° C. and a pressure of 1850-2000 bars with a constant temperature increase relevant to time.

International Patent Publication No. WO/2006/099386 (Massachusetts Institute of Technology) discloses a method for the manufacture of colloidal III-V nanoparticles. The method of manufacture comprises reacting a solution of comprises at least one source material including a group III element with a source material. The source material includes including a group V element and a reducing agent in a solvent. The solvents used in the manufacturing methods disclosed in this patent application are not high boiling solvents. The manufacture of the III-V nanoparticles is conducted at high pressures in sealed containers.

In the literature there are a number of references to the manufacture of III-V semi-conductor compounds. For example. Micic et al "Synthesis and Characterisation of InP. GaP and GaInP$_2$, J. Phys. Chem. 1995, 99, 7754-7759, discloses a method for the manufacture and characterisation of InP, GaP and GaInP$_2$ quantum dots. This document discloses a method for the manufacture of InP by mixing a chloro-indium oxalate complex with P(SiMe$_3$)$_3$ in a molar ratio of In:P 1.6:1. The authors utilise trioctylphosphine oxide (TOPO) and trioctylphosphine (TOP) in this manufacture method.

Malik et al in "Gallium Arsenide Nanoparticles: Synthesis and Characterisation", J. Mater. Chem., 2003, 13, 2591-2595, disclose the manufacture of GaAs nanoparticles from GaCl$_3$ and As(NMe$_2$)$_3$, by slowly heating at 167° C. for 7 days. The P(SiMe$_3$)$_3$ compounds used in this publication are highly explosive and inflammable as well as being relatively expensive.

None of the prior art discloses a simple method for the manufacture of III-V particles as disclosed herein.

SUMMARY OF INVENTION

The present invention discloses a method for the manufacture of III-V compounds. Examples of the III-V compounds are used in semi-conductors. The method for manufacturing the III-V compounds comprises; reacting a solution containing at least one source material including a group III element and a source material including a group V element. The reaction is conducted in a high boiling point solvent. The reaction is conducted in an inert atmosphere and at atmospheric pressure. The high boiling point solvent comprises a stabiliser and a reducing agent. The reaction is conducted for a predetermined period of time and at a predetermined temperature. The manufactured III-V compound is precipitated from the high boiling point solvent and isolated.

In an aspect of the present invention, the solution of the high boiling point solvent and the stabiliser as well as the group V source is a solution of trioctylphosphine oxide and trioctylphosphine (TOPO/TOP). The trioctylphosphine oxide and trioctylphosphine (TOPO/TOP) has the advantage that no additional group V element (where the product is a III-P compound) is required.

After the reaction is complete the manufactured III-V compound is precipitated from the reaction solution by the addition of a polar organic liquid. The polar organic liquid includes, but is not limited to methanol, ethanol, propanol or acetone. The manufactured III-V compound is centrifuged and filtered from the reaction solution. The manufactured III-V compound is further purified by being re-dissolved in a non-polar organic liquid such as toluene and precipitated from the resultant solution by the addition of a polar organic liquid. The manufactured III-V compounds are then filtered and isolated. The purification process may be repeated a number of times.

The predetermined temperature for the reaction to progress for the manufacture of the III-V compounds is from 100° C. to above 350° C. The predetermined time period for the reaction to go to completion is from 1 to 30 hours.

The source material for the group III compound can be selected from a group consisting of a group III salt, a group III oxide or a group III acetate. The source material for the group V compound can be a II-V compound, whereby the group II-V compound is selected from a group consisting of Ca$_3$P$_2$ or Mg$_3$As$_2$. The source material for the group V compound can also be triphenylphosphine (PPh$_3$). This can also be used as the high boiling point solvent in the method for manufacture.

For the method for manufacture to proceed effectively the high boiling point solvent contains a stabiliser. The stabiliser includes but is not limited to trioctyl-phosphine/trioctylphosphine oxide. The stabiliser can also be a long chain amine. The stabiliser can also be a mixture of trioctylphosphine/trioctylphosphine oxide and the long chain amine.

The high boiling point solvent also contains a reducing agent. The reducing agent is a Lewis base. The reducing agent includes, but is not limited to, butyl-lithium (Buli) or potassium borohydride.

The materials used in this method of manufacture are all reasonably inexpensive. The materials and equipment used in this method of manufacture are easily accessible. This method for the manufacture of III-V compounds provides a cheaper and less hazardous method for than the methods for manufacture disclosed in the prior art.

DESCRIPTION OF DRAWINGS

The invention is described with reference to the following drawings in which.

DETAILED DESCRIPTION OF THE INVENTION

Figure 1:
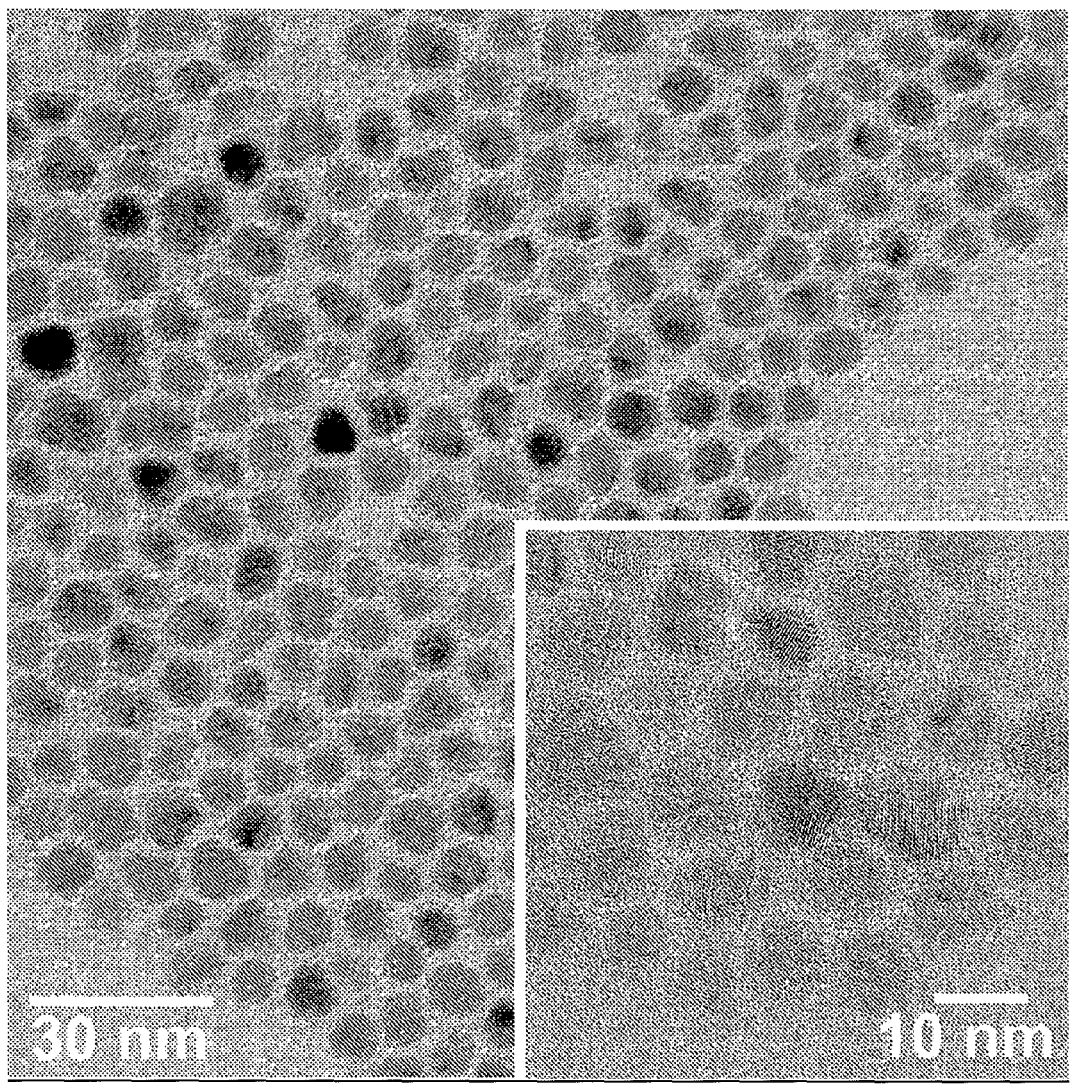
FIG. 1 shows TEM images of indium phosphide nanoparticles.

For a complete understanding of the present invention and the advantages thereof, reference is made to the following detailed description taken in conjunction with the accompanying Figures.

It should be appreciated that the various aspects of the present invention disclosed herein are merely illustrative of specific ways to make and use the invention and do not therefore limit the scope of invention when taken into consideration with the appended claims and the following detailed description and the accompanying Figures.

It should be realised that features from one aspect of the invention will be apparent to those skilled in the art from a consideration of the specification or practice of the invention disclosed herein and these features can be combined with features from other aspects of the invention.

The invention teaches a method for the manufacture of III-V particles. In particular semi-conducting particles. A "nanoparticle" is typically defined as being a particle having dimensions less than 100 nm. However, it should be noted that this invention is not restricted to particles having these dimensions or smaller, but is equally applicable to III-V semi-conducting nanoparticles having larger dimensions.

The method for the manufacture of the III-V particles proceeds in the following manner:

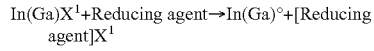

followed by:

$In(Ga)° + X^2P(As) \rightarrow InP, InAs, GaP, GaAs,$

In which $In(Ga)X^1$ is either a salt, an oxide or an acetate of indium or gallium. Examples of $In(Ga)X^1$ include, but are not limited to $InCl_3$. The $In(Ga)X^1$ compounds provide the III source for the III-V particles.

$X^2P(As)$ is a metal phosphide, a metal arsenide or an alkyl phosphine. Examples of $X^2P(As)$ include, but are not limited to. $Ca_3P_2$, $Mg_3As_2$ or $PPh_3$. The $X^2P(As)$ compounds provide the V source for the III-V particles.

$X^2P$ can also be a high boiling point solvent, i.e. TOPO/TOP (as will be discussed later)

The reaction is carried out in a solvent that has a high boiling point. In the method for the manufacture of the III-V particles the high boiling point solvent also contains a stabiliser and a reducing agent.

One aspect for the manufacture of III-V particles according to the present invention would be to carry out the reaction in a high boiling point solvent of trioctylphosphine oxide and trioctylphosphine (TOPO/TOP) for at least one hour at a temperature of above 100° C. and preferably at 120° C. The high boiling point solvent is initially evacuated under vacuum to remove any volatile impurities present in the high boiling pint solvent. The trioctlyphosphine oxide and trioctylphosphine in this aspect of the invention is the high boiling point solvent, a colloidal stabiliser and a phosphorus source. In this aspect of the invention and in further aspects. TOPO/TOP is used for the manufacture of III-P compounds. (See the article by Micic et al discussed in the prior art section and the paper by Murray. Norris et al).

Further examples of the high boiling point solvents include, but are not limited to, hexadecylamine and a mixture of octadecene (known to have a high boiling point but which is not a stabiliser) with a long-chained amine (such as hexadecylamine or a similar compound that will act as a colloidal stabiliser). In aspects of the invention where triphenylphosphine is used as the phosphorus source, the triphenylphosphine is used directly as the reaction solvent as it has a relatively low melting point, but has a high boiling point.

The reducing agents employed are Lewis bases but in a further aspect of the present invention can be, butyl lithium (Buli) or potassium borohydride ($KBH_4$).

A mixture containing the reduced III compound and the V compound is prepared. The reaction mixture is then heated to at least 250° C., but the upper temperature can exceed 350° C. The reaction is allowed to continue for 30 hours at the heated temperature.

The III-V particles were precipitated from the reaction solution using a polar organic solvent. Examples of suitable polar organic solvents used for the precipitation of the III-V particles include but are not limited to, methanol, propanol, ethanol and acetone. The precipitated III-V particles were washed with an organic liquid, such as methanol and toluene.

The III-V particles of the invention can be used as nanodots.

EXAMPLES

Example 1

Preparation of Indium Phosphide Nanoparticles, According to the Following Equation

In a glove box 1 g trioctylphosphine oxide (from Aldrich) and 10 ml trioctyl-phosphine (from Fluka) were added together in a 25 ml three-necked flask. The solution was evacuated for 1.5 hours at 120° C. to remove the volatile components.

Subsequently 1 ml of 0.5M solution of InCl$_3$ (Aldrich) in trioctylphosphine was added to the solution which was subsequently heated to 300° C. Dropwise 0.5 mmol of butyl-ithium (from Merck) in 1 ml hexane (from Merck) was added to the hot solution.

The reaction was complete after 20 hours. The precipitate was separated from the solution through centrifugation. Subsequently the particles were extracted through the addition of methanol (from Merck) and then further centrifugation. The particles were further extracted with toluene (from Aldrich) and again with methanol. This washing process was repeated 4 times.

Figure 2:
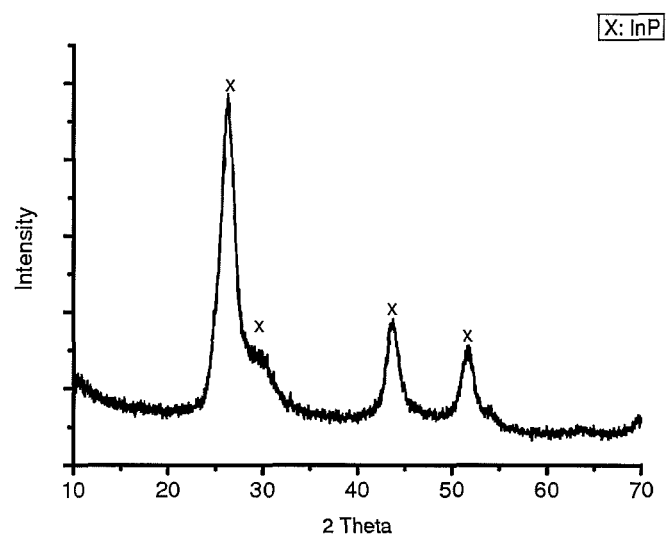
FIG. 2 shows XRD images of indium phosphide nanoparticles.

The particles were characterised by TEM (FIG. 1) and XRD (FIG. 2)

Example 2

Preparation of Indium Phosphide Nanoparticles According to the Following Equation

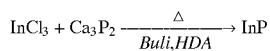

In a glove box in a 25 ml three-necked flask 9.0 g of hexadecylamine (Merck), 0.1 g InCl$_3$ (Alfa) and 0.8 g Ca$_3$P$_2$ (ABCR) was added. The suspension was evacuated for 1.5 hours at 120° C. to remove the volatile components.

The solution was heated to 300° C. Subsequently 0.5 mmol of butylithium (from Merck) in 1 ml hexane (from Merck) was added to the hot solution dropwise.

The reaction was complete after 20 hours. The sediment was separated from the reaction solution through centrifugation. Subsequently the particles were extracted through the addition of methanol (from Merck) and further centrifugation. The particles were further extracted with toluene (from Aldrich) and again with methanol. This washing process was repeated 4 times.

Figure 3:
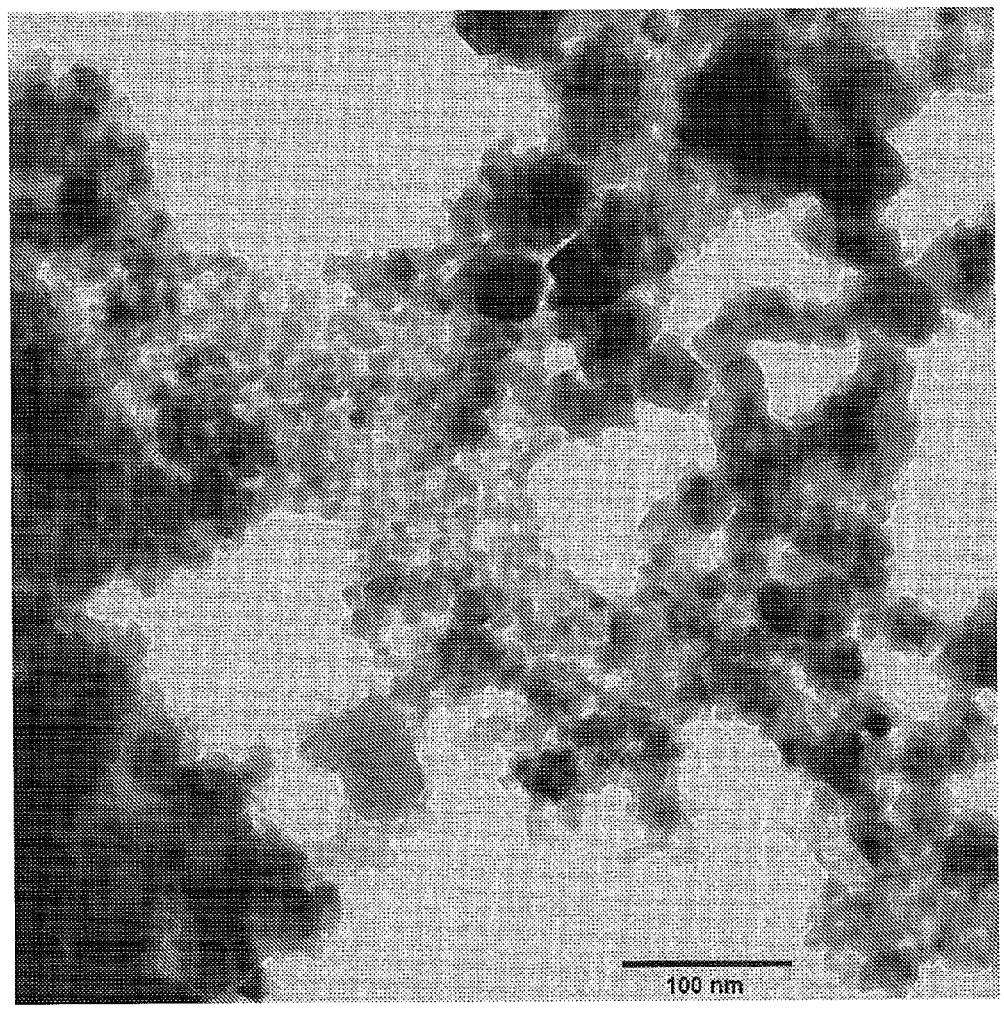
FIG. 3 shows TEM images of indium phosphide nanoparticles.
Figure 4:
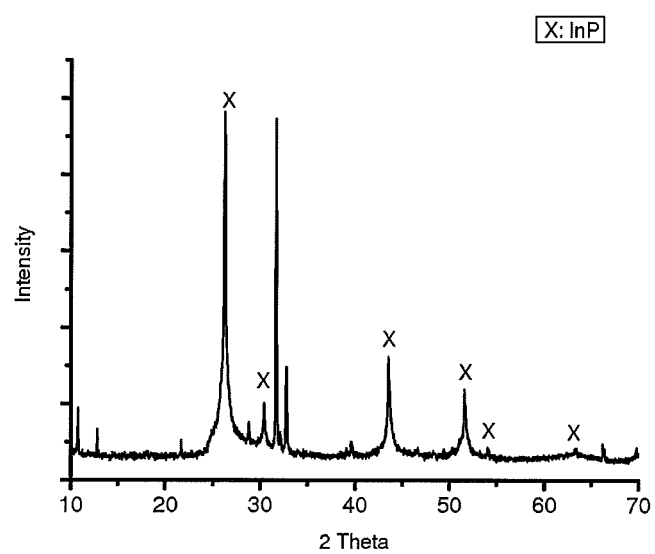
FIG. 4 shows XRD images of indium phosphide nanoparticles.

The particles were characterised by TEM (FIG. 3) and XRD (FIG. 4).

Example 3

Preparation of Indium Phosphide Nanoparticles According to the Following Equation

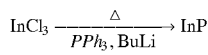

In a glove box in a 25 ml three-necked flask was added 10 g of triphenylphosphine (Fluka), 0.1 g InCl$_3$ (Alfa). The suspension was evacuated for 1.5 hours at 120° C. to remove the volatile components.

The solution was subsequently heated to 300° C. 0.5 mmol of butylithium (from Merck) in 1 ml hexane (from Merck) was added to the hot solution dropwise.

The reaction was complete after 20 hours. The sediment was separated from the solution through centrifugation. Subsequently the particles were extracted through the addition of methanol (from Merck) and further centrifugation. The particles were further extracted with toluene (from Aldrich) and again with methanol. This washing process was repeated 4 times.

Figure 5:
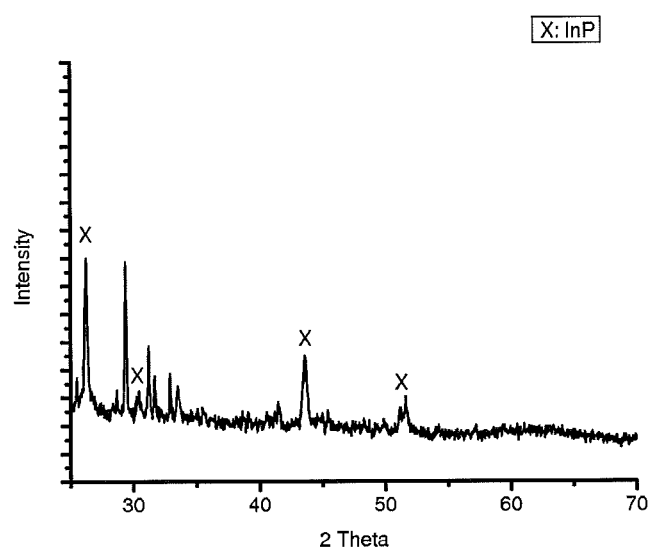
FIG. 5 shows XRD images of indium phosphide nanoparticles.

The particles were characterised by XRD (FIG. 5).

Example 4

Preparation of Indium Arsenide Nanoparticles According to the Following Equation

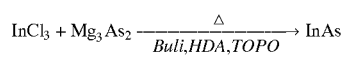

In a glove box in a 25 ml three-necked flask was added 3 g of trioctlyphosphine oxide (Aldrich), 7 g of Hexadecylamine (Fluka), 0.06 g Mg$_3$As$_2$ (Aldrich) and 0.06 g InCl$_3$ (Aldrich). The mixture was evacuated for 1.5 hours at 120° C. to remove the volatile components.

The solution was subsequently heated to 300° C. 0.5 mmol of butylithium (from Merck) in 1 ml hexane (from Merck) was added to the hot solution dropwise.

The reaction was complete after 20 hours. The sediment was separated from the solution through centrifugation. Subsequently the particles were extracted through the addition of methanol (from Merck) and further centrifugation. The particles were further extracted with toluene (from Aldrich) and again with methanol. This washing process was repeated 4 times.

Figure 6:
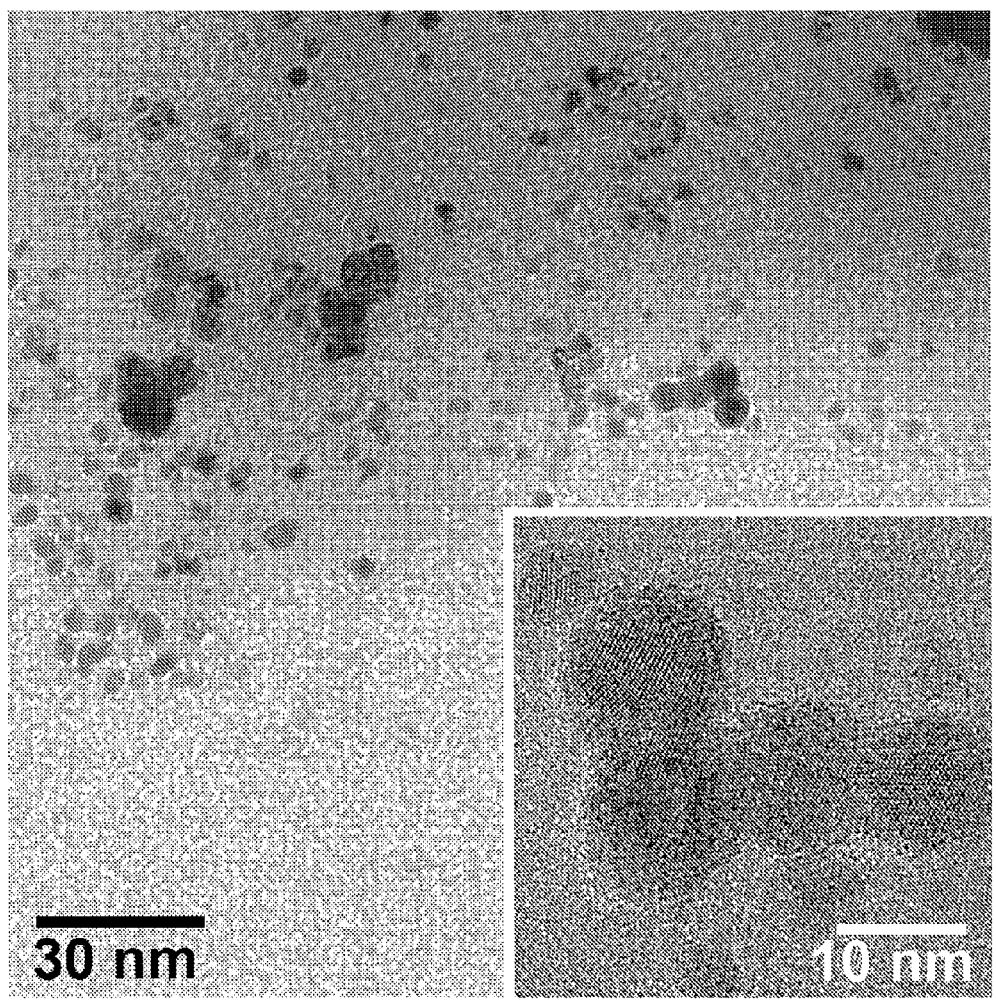
FIG. 6 shows TEM images of indium arsenide nanoparticles.
Figure 7:
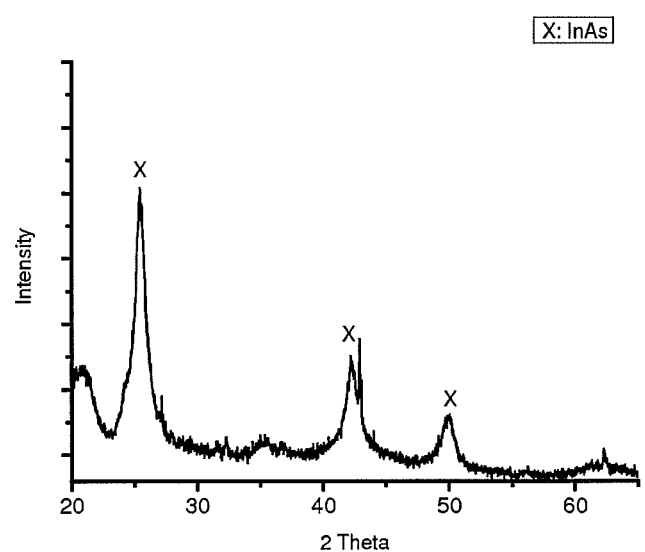
FIG. 7 shows XRD images of indium arsenide nanoparticles.

The particles were characterised by TEM (FIG. 6) and XRD (FIG. 7).

Example 5

Preparation of Gallium Arsenide Nanoparticles According to the Following Equation

In a glove box in a 25 ml three-necked flask was added 1 g of trioctlyphosphine oxide (Aldrich), 10 ml of octadecene (Fluka), 0.032 g Mg$_3$As$_2$ (Aldrich) and 0.044 g GaCl$_3$ (Aldrich). The mixture was evacuated for 1.5 hours at 120° C. to remove the volatile components.

The solution was subsequently heated to 315° C. 0.75 mmol of butylithium (from Merck) in 4 ml hexane (from Merck) was added to the hot solution dropwise.

The reaction was complete after 4 hours. The sediment was separated from the solution through centrifugation. Subsequently the particles were extracted through the addition of methanol (from Merck) and further centrifugation. The particles were further extracted with toluene (from Aldrich) and again with methanol. This washing process was repeated 4 times.

Figure 8:
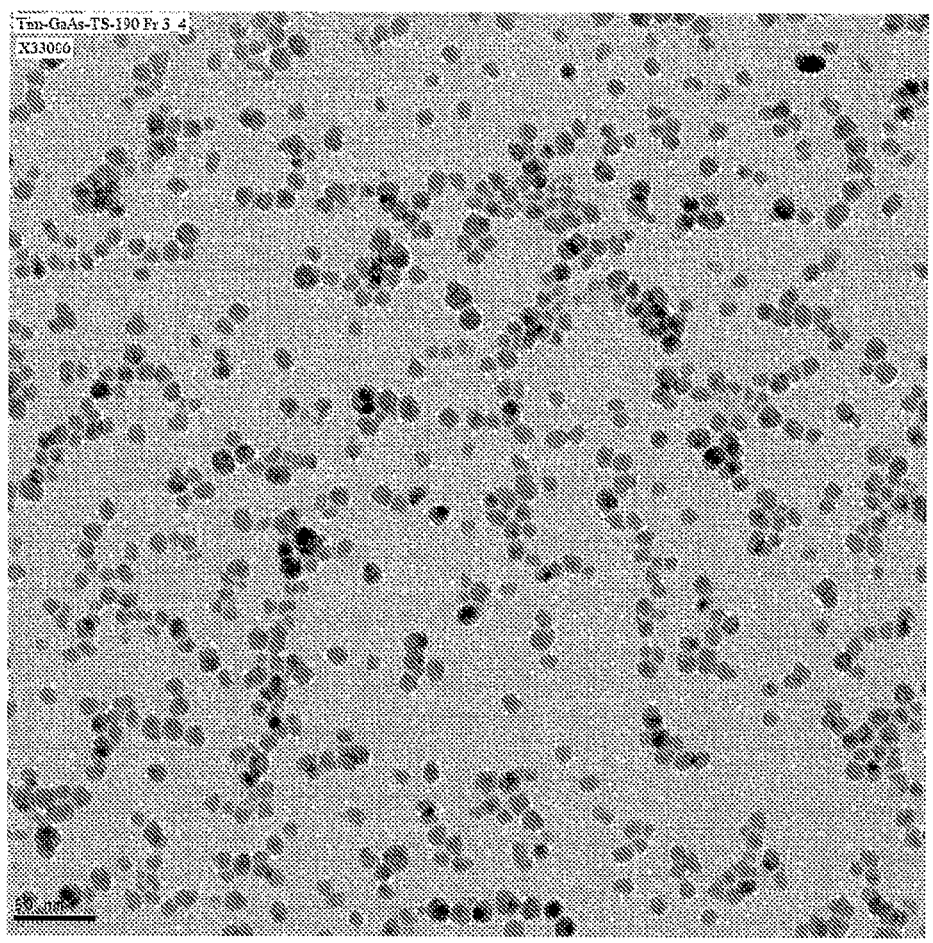
FIG. 8 shows TEM images of gallium arsenide nanoparticles.
Figure 9:
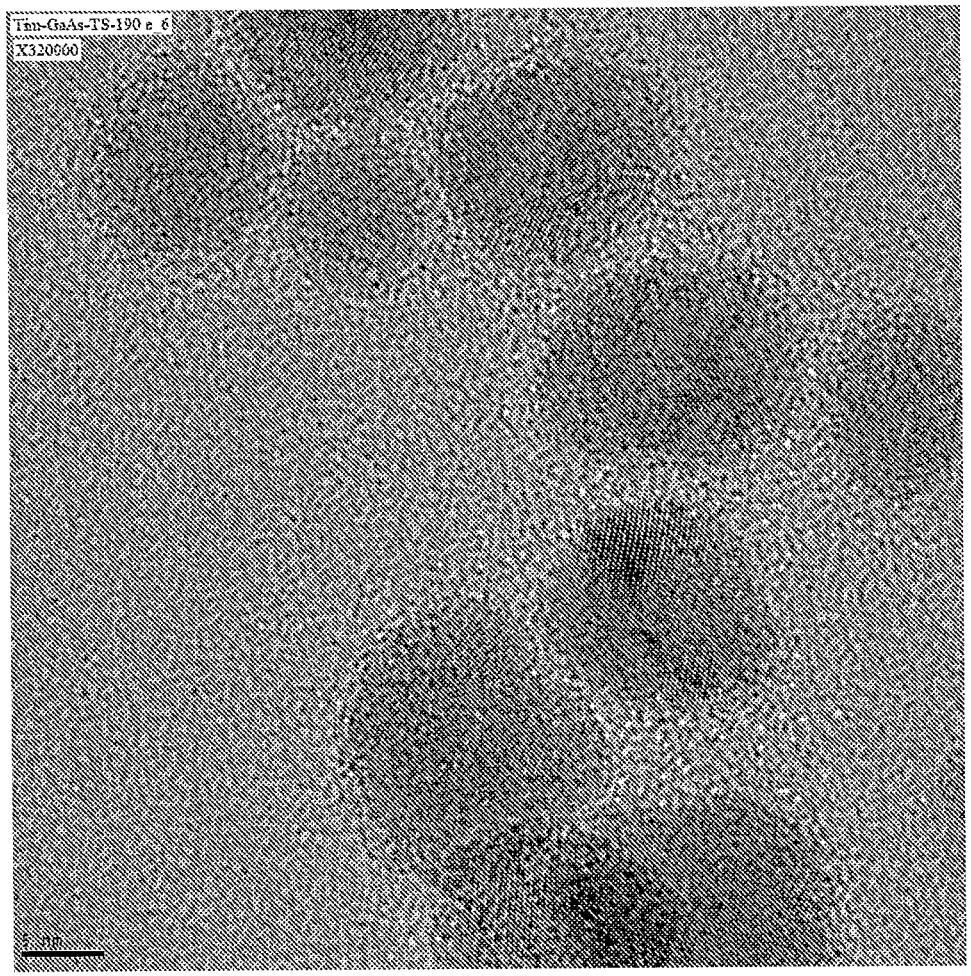
FIG. 9 shows Hi Resolution TEM images of gallium arsenide nanoparticles.

The particles were characterised by TEM (FIG. 8) and Hi Resolution TEM (FIG. 9).

It is intended that the specification and examples be considered as exemplary only, with the true scope of the invention being indicated by the following claims.

What is claimed is:

1. A method for manufacturing particles of a III-V compound comprising gallium or indium as a III component, and phosphorous or arsenic as a V component, said method comprising:
   (i) adding a reducing agent to a heated solution, wherein said heated solution comprises:
       a solvent;
       a stabilizer;
       a Group III compound selected from the group consisting of Group III salts and Group III oxides; and
       a Group V compound selected from the group consisting of metal phosphides and metal arsenides, wherein the Group V compound is a phosphide or an arsenide of magnesium or calcium,
       to form a resultant solution;
   (ii) heating the resultant solution;
   (iii) isolating particles of the III-V compound as a precipitate from the heated resultant solution; and
   (iv) purifying the particles.

2. A method according to claim 1, further comprising inducing precipitation of the III-V compound from the heated resultant solution in step (ii) by adding a polar organic liquid.

3. A method according to claim 1, comprising centrifuging the precipitated particles of III-V compound from the heated resultant solution.

4. A method according to claim 1, wherein the purifying of step (iv) comprises dissolving the particles isolated in step (iii) in a non-polar organic solvent and adding a polar organic solvent to precipitate purified particles.

5. A method according to claim 4, wherein the non-polar organic solvent is toluene.

6. A method according to claim 2, wherein the polar organic liquid is methanol, ethanol, propanol, or acetone.

7. A method according to claim 1, wherein the solution is heated in step (ii) to at least 250° C.

8. A method according to claim 1, wherein the Group III salt is a Group III acetate.

9. A method according to claim 1, wherein the Group V compound is $Ca_3P_2$ or $Mg_3As_2$.

10. A method according to any one of claims 1 and 9, wherein the stabilizer comprises at least one of (a) trioctylphosphine and trioctylphosphine oxide and (b) a long-chain amine.

11. A method according to any one of claims 1 and 9 wherein the reducing agent is a Lewis base.

12. A method according to claim 11, wherein the Lewis base is butyl lithium or potassium borohydride.

* * * * *

UNITED STATES PATENT AND TRADEMARK OFFICE
CERTIFICATE OF CORRECTION

PATENT NO. : 8,753,592 B2
APPLICATION NO. : 12/744157
DATED : June 17, 2014
INVENTOR(S) : Tim Strupeit et al.

It is certified that error appears in the above-identified patent and that said Letters Patent is hereby corrected as shown below:

On the Title page, Item (56) other publications: "Sun, Z. et al. , "A Novel Approach for the Preparation of IP NanoCrystals", "Material Research Society Symposium Proc.", 2006. pp. 16, vol. 942, Publisher: Material Research Society." should be -- Sun, Z. et al., "A Novel Approach for the Preparation of IP NanoCrystals", "Material Research Society Symposium Proc.", 2006. pp 1-6, vol. 942, Publisher: Material Research Society. --.

In the Specification

Column 1, line 62: "example." should be -- example, --.

Column 2, line 64: "trioctyl-phosphine" should be -- trioctylphosphine --.

Column 4, line 28: "Murray. Norris" should be -- Murray, Norris --.

Column 5, line 2: "trioctyl-phosphine" should be -- trioctylphosphine --.

Signed and Sealed this
Twenty-third Day of September, 2014

Michelle K. Lee
*Deputy Director of the United States Patent and Trademark Office*